United States Patent [19]

Ozawa et al.

[11] 4,413,188
[45] Nov. 1, 1983

[54] CAMERA TUBE APPARATUS FOR READING DOCUMENTS

[75] Inventors: Takashi Ozawa; Mutsuo Takenouchi, both of Kanagawa, Japan

[73] Assignee: Fuji Xerox Co., Ltd., Tokyo, Japan

[21] Appl. No.: 279,873

[22] Filed: Jul. 2, 1981

[30] Foreign Application Priority Data

Dec. 10, 1980 [JP] Japan .............................. 55-173227

[51] Int. Cl.³ ............................................. H01J 40/14
[52] U.S. Cl. ................................. 250/578; 250/211 R
[58] Field of Search .................. 250/578, 209, 211 R, 250/211 J; 357/30, 31, 32; 358/212, 213

[56] References Cited

U.S. PATENT DOCUMENTS 3,676,590 7/1972 Weimer ........................ 250/211 R
4,382,187 5/1983 Fraleux et al. ...................... 357/32

Primary Examiner—David C. Nelms
Attorney, Agent, or Firm—Sughrue, Mion, Zinn, Macpeak and Seas

[57] ABSTRACT

A camera tube apparatus for use in reading a document reader, such as in a facsimile system, which provides for accurate output from light-receiving devices with crosstalk eliminated. In this apparatus, at least one surface of a connecting electrode connecting a split electrode and a reading switch is provided through an insulative layer with a conducting layer connected to ground. The capacitance formed between the connecting electrode and the conducting layer is made greater than that of the light-receiving device.

5 Claims, 7 Drawing Figures

CAMERA TUBE APPARATUS FOR READING DOCUMENTS

BACKGROUND OF THE INVENTION

The present invention relates to a camera tube apparatus for reading documents.

Heretofore, as a camera tube device for a documentreading apparatus for use in facsimile system and so forth, a MOS photo-diode array, a CCD device and the like have been used.

Since these camera tube devices are fabricated using integrated circuits (ICs), the size of the camera tube device per se can be miniaturized. In reading a document with such miniaturized camera tube devices, however, it is necessary to reduce the size of images by the use of an optical system using lenses or the like. As a result, a high accuracy is required in aligning the camera tube device with the optical system and difficulties have been encountered in miniaturizing the overall size of the manuscript reader.

In addition, a document reader has been proposed which uses camera tube devices having an array length equal to the width of the documents to be read. In the reader, 1:1 image formation is performed by an optical fiber array or a lens array used as the optical system. A light-receiving part of the camera tube device of the type described above has been fabricated by providing a photoconductive semiconductor on an insulating substrate, such as glass, for example, by using mask deposition techniques.

The use of the manuscript reader as described above permits the miniaturization of the manuscript reader because the image-formation path length can be reduced. In such an apparatus, however, it is difficult to construct a switching device for scanning and driving the camera tube device on the same substrate. Therefore, it has been necessary to interconnect the insulating substrate on which the light-receiving part is formed and the substrate on which the switching device is formed.

Hereinafter, the structure of a conventional camera tube apparatus for use in a document reader will be explained with reference to the accompanying drawings, wherein FIG. 1 is a schematic view of the conventional camera tube apparatus as described hereinafter and FIG. 2 is a sectional view taken along a line II—II.

Referring to FIG. 1, the conventional camera tube apparatus includes a camera tube device 1, a switching device 2, an insulating substrate 3, a split electrode 4, a photoconductive semiconductor layer 5 which is provided on the top surface of the insulating substrate 3 in such a manner that part of the layer is superposed on the split electrode 4, and a transparent electrode 6 which is provided on the top surface of the insulating substrate 3 in such a manner that part of the layer is superposed on the photoconductive semiconductor layer 5. Additionally, reference numerals 7 and 8 indicate, respectively, a switching IC and a connection electrode to connect the split electrode 4 and the switching IC 7.

In the foregoing conventional camera tube apparatus, the split electrode 4 is fabricated by providing a metal layer, such as gold, chromium or the like, in a thickness of about 500 to 1,000 Å on the insulating substrate 3, which may, for instance, be glass, in such a manner that the pitch thereof corresponds to a desired degree of resolution, for example, in a ratio of 10 lines/mm.

The photoconductive semiconductor layer 5, which is constructed on the split electrode 4 with a thickness of 0.5 to 5 $\mu$m by vapor-deposition, for example, is composed of amorphous or polycrystalline Se, Se-Te, CdS, CdSe or the like. The transparent electrode 6 is provided on the photoconductive semiconductor layer 5 in a thickness of 500 to 3,000 Å by sputtering, for example.

The photoconductive semiconductor layer 5 is sandwiched between the split electrode 4 and the transparent electrode 6. The split electrode 4 and transparent electrode 6, which have an overlapped area corresponding to a picture element, form a light-receiving device P.

The switching device 2 is implemented with integrating switching ICs 7 (e.g., MOS-FETs) on the substrate. The switching device 2 includes connection electrodes 8, which extend to corresponding switches (not shown), arranged with the same pitch as the split electrodes 4. Each connection electrode 8 is connected to a corresponding split electrode 4 at the terminal thereof by a technique such as contact bonding.

FIG. 3 is an equivalent circuit diagram of the camera tube apparatus for explaining the driving system of the foregoing camera tube device 1. In the figure, the same symbols and reference numerals as used in FIG. 1 are used to indicate the same or equivalent parts. Cp1 to Cp5 indicate capacitances of the light-receiving devices P, D a photodiode formed by the light-receiving device P, Cl$_1$ to Cl$_4$, interline capacitances, S1 to S5 switches, Cs1 to Cs5, switch input capacities, t an output terminal, and R a load resistance.

Each connection electrode 8 is several centimeters long. If the wire density is high, significant interline capacitances Cl$_1$ to Cl$_4$ are present. In this case, among the light-receiving device capacitance Cp, interline capacitance Cl and switch input capacitance Cs, the relation of Cp<Cl≦Cs generally exists.

FIG. 4 is an equivalent circuit diagram of the camera tube apparatus used to explain the operation thereof with the output of the light-receiving devices P1 to P5 of the camera tube deivce 1 having the foregoing structure. In the figure, the same symbols and reference numerals as used in FIG. 3 indicate the same parts as in FIG. 3. Using a camera tube apparatus having the foregoing structure, a document is read as follows:

At the start of a reading operation, the switches S1 to S5 are closed to charge the capacitances Cp1 to Cp5 of the light-receiving devices P1 to P5 to a voltage of VO. Then, light-irradiation is applied onto the light-receiving devices P1 to P5 in a state where the switches S1 to S5 are opened.

Referring to the light-receiving device P1, electric charge is produced by the photodiode D according to the intensity of light irradiation. The charges thus generated flows into the corresponding switch capacitance Cs1 and is stored therein. Therefore, as time passes and charge flows, the potential at the point A increases. Then, when the switch S1 is closed, the switch capacitance Cs1 discharges, as a result of which the light-receiving device capacitance Sp1 is charged and at the same time the potential at the point A is decreased to the ground level.

At this time, by sensing a current i$_1$ at an output terminal t, an output is obtained. In this case, since the potential at the point A changes, currents i$_2$ to i$_5$ flow as indicated in FIG. 4 through the interline capacitances Cl₁ to Cl₄ in addition to the signal current i₁ from the light-receiving device P1. This leads to so-called "crosstalk" between adjacent channels or lines, and thus the output of the light-receiving device P1 is not as precisely representative of the document read as is desirable.

SUMMARY OF THE INVENTION

An object of the invention is thus to overcome the defects as described above by improving the structure of a camera tube apparatus, specifically to provide a camera tube apparatus which permits the production of an output of a light-receiving device without the presence crosstalk.

In accordance with the this and other objects of the invention, there is provided a document-reading camera tube apparatus including a photoconductive layer, a plurality of split electrodes provided on one surface of the photoconductive layer, and a plurality of common electrodes provided on the other surface of the photoconductive layer with each of the common electrodes overlying an end portion of a corresponding split electrode thus forming a light-receiving device therebetween. At least one of the split electrodes and common electrodes is transparent. A plurality of reading switches is provided each of which is connected between a corresponding light-receiving device and a corresponding reading output terminal. Connecting electrodes have a first end connected to a corresponding split electrode and a second end coonected to a corresponding reading switch. At least one insulating layer is disposed adjacent the connecting electrodes and a conducting layer is formed on an outer surface of the insulating layer opposite the electrodes. The dimensions and materials of the conducting layer and insulating layer are determined such that the capacitances formed between the electrodes and the conducting layer are significantly greater than the capacitances of the light-receiving devices. In a preferred embodiment, two insulating layers and two conducting layers are provided with the conducting layers sandwiching the electrodes through the insulating layers. One of the conducting layers is grounded. Also, it is preferable that the capacitances formed between the connecting electrodes and the grounded conducting layer be significantly greater than the capacitances formed between adjacent connecting electrodes.

DESCRIPTION OF THE PREFERRED EMBODIMENTS

Figure 1:
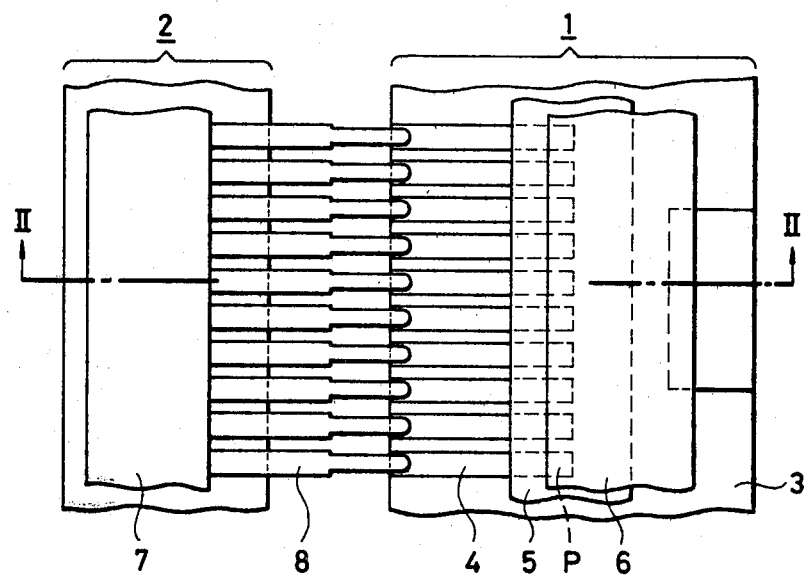
FIG. 1 is a schematic view of a conventional camera tube apparatus.
Figure 2:
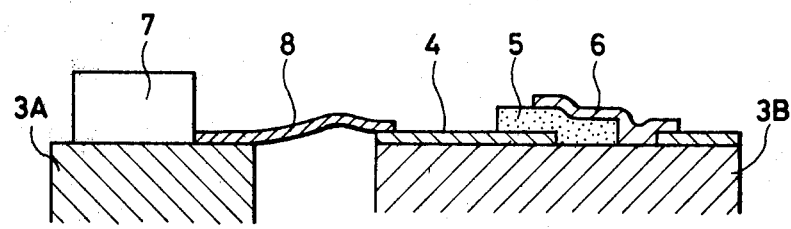
FIG. 2 is a cross-sectional view taken along a line II—II in FIG. 1.
Figure 5:
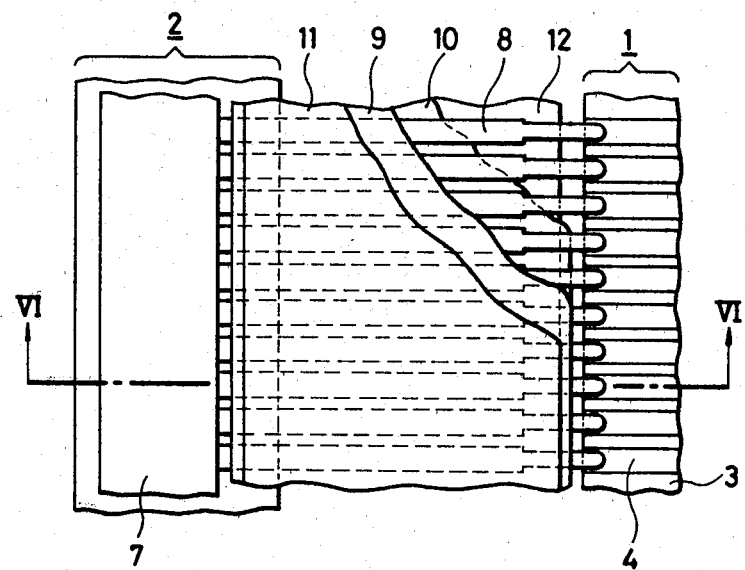
FIG. 5 is a schematic view of a preferred embodiment of a camera tube apparatus of the invention.
Figure 6:
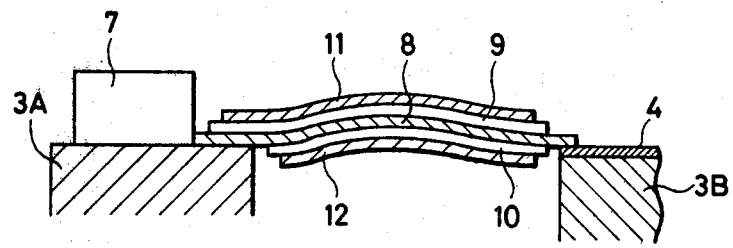
FIG. 6 is a cross-sectional view taken along a line VI—VI in FIG. 5.

The invention will hereinafter be explained with reference to the accompanying drawings of which FIG. 5 is a schematic view of a preferred embodiment of a camera tube apparatus of the invention and FIG. 6 is a cross-sectional view taken along a line VI—VI in FIG. 5. In the drawings, the same symbols and reference numerals as used in FIG. 1 indicate the same or equivalent parts.

Referring to FIG. 5, reference numerals 9 and 10 indicate insulating layers and 11 and 12 indicate conducting layers. A connecting electrode 8, which connects a split electrode 4 and a swiching IC 7, is sandwiched between the insulating layers 9 and 10 and between the conducting layers 11 and 12. The conducting layers 11 and 12 are electrically grounded. That is, the connecting electrode 8 is effectively shielded by the conducting layers 11 and 12.

Figure 7:
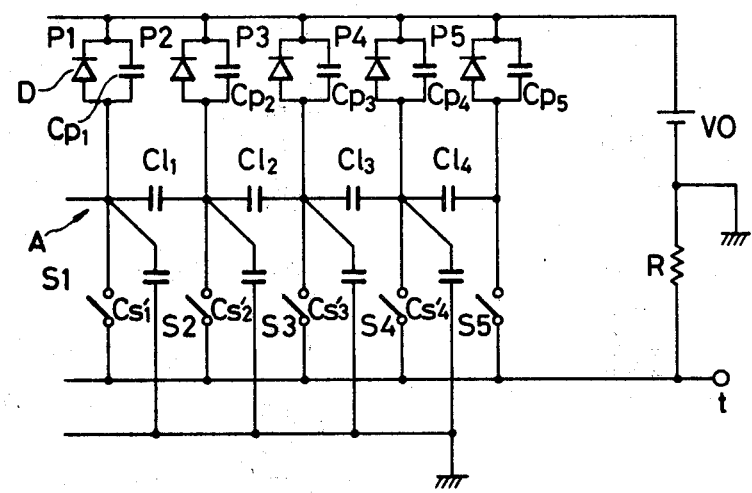
FIG. 7 is an equivalent circuit diagram of the camera tube apparatus of FIG. 5 used to explain the formation of an output of a light-receiving device.

FIG. 7 is an equivalent circuit diagram of the camera tube apparatus used to explain the formation of outputs of the light-receiving devices P₁ to P₅ of a camera tube device 1. In this figure, the same symbols and reference numerals as used in FIG. 3 indicate the same or equivalent parts.

Figure 3:
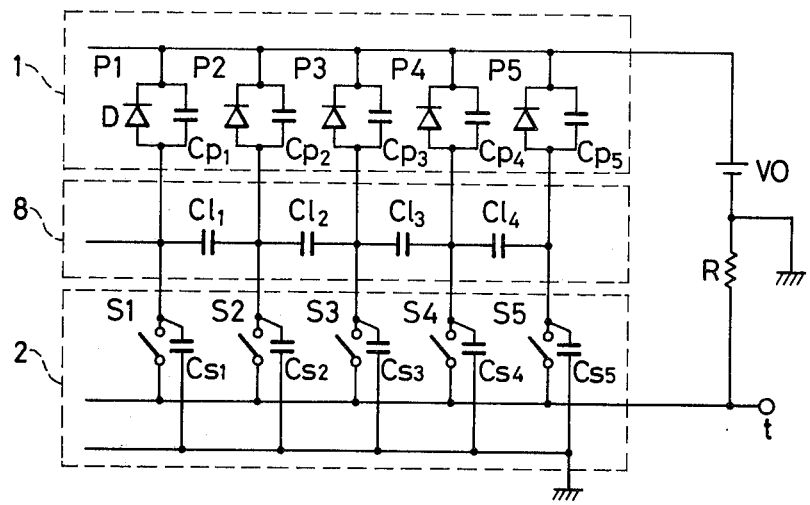
FIG. 3 is an equivalent circuit diagram of the camera tube apparatus of FIG. 1 used to explain the driving system thereof.
Figure 4:
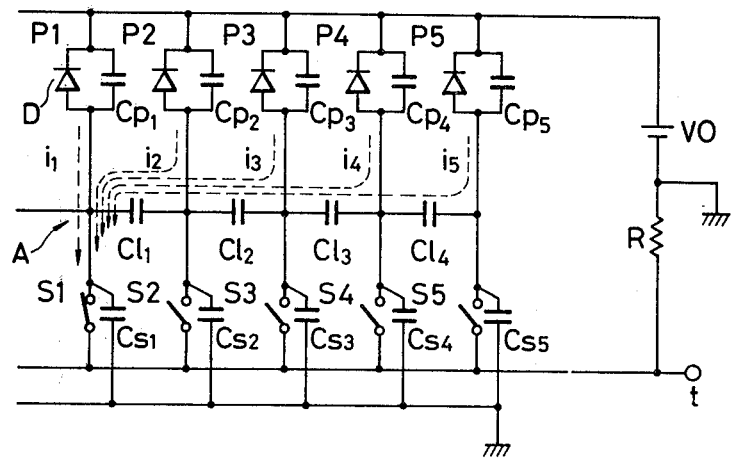
FIG. 4 is an equivalent circuit diagram of the camera tube apparatus of FIG. 1 used to explain the formation of an output from a light-receiving device.

As can be seen from the figure, in FIG. 7, a capacitance formed by the connecting electrode 8 and the conductor layers 11 and 12 is added to a switching capacitance Cs, as compared with the equivalent circuit of FIG. 3. The resulting capacitance value is the sum of the two, namely, Cs', which capacitance hereinafter is referred to as a "shielding capacitance". In this case, the connecting electrode 8, the insulating layers 9 and 10 and the conducting layers 11 and 12 are constructed so that the relation $Cp < Cl \leq Cs'$ exists between the light-receiving capacitance Cp, the interline capacitance Cl and the shielding capacitance Cs'. Therefore, although charge produced in the photodiode D upon irradiation thereof with light is stored in a shield capacitance Cs'1, the increase in potential at the point A is very small compared with that in FIG. 4 because $Cp << Cs'$.

Thus, even when the switch S1 is closed discharging the shielding capacitance Cs'1 and charging a light-receiving device capacitance Cp1, the change in potential at the point A is small. This reduces the electric current flowing through the interline capacitances Cl₁ to Cl₄. As a result, crosstalk is prevented, and it becomes possible to read out correctly the outputs of light-receiving devices P1 to p5.

The structure of this embodiment can be easily produced, for example, by providing about 10 to 100 μm thick copper foils as the connecting electrode 8, and the conducting layers 11 and 12, and by using about 10 to 100 μm thick flexible polyimide films as the insulating layers 9 and 10.

Although in this embodiment the connecting electrode is sandwiched through the insulating layers between the grounded conducting layers, it is apparent that only one side of the connecting electrode is provided with the grounded conducting layer through the insulating layer.

In accordance with the invention, as described above, a sufficiently great shielding capacitance is formed at the connecting electrode because the connecting electrode is sandwiched between the insulating and conducting layers. As a result, the output of a light-receiving device can be correctly read without the presence of crosstalk.

Furthermore, since mixing of external noise is prevented because the connecting electrode is electrically shielded, it is possible to lengthen the connecting electrode. This leads to the advantage that practical construction of the apparatus is facilitated.

What is claimed is:

1. A document-reading camera tube apparatus comprising:
   a photoconductive layer;
   a plurality of split electrodes provided on one surface of said photoconductive layer;
   a plurality of common electrodes provided on the other surface of said photoconductive layer, each said common electrode overlying an end portion of a corresponding split electrode forming a light-receiving device therebetween, at least one of said split electrodes and common electrodes being transparent;
   a plurality of reading switches, each said reading switch being connected between a corresponding light-receiving device and a corresponding output terminal;
   a plurality of connecting electrodes, each said connecting electrode having a first end connected to a corresponding split electrode and a second end connected to a corresponding reading switch;
   at least one insulating layer disposed adjacent said connecting electrodes; and
   at least one conducting layer disposed on an outer surface of said at least one insulating layer opposite said electrodes, wherein capacitances formed between said electrodes and said conducting layer are significantly greater than capacitances of said light receiving devices.

2. The document-reading camera tube apparatus as claimed in claim 1, wherein capacitances formed between said connecting electrodes and said at least one conducting layer is significantly greater than capacitances formed between adjacent connecting electrodes.

3. The document-reading camera tube apparatus as claimed in claim 1 wherein first and second insulating layers are provided diposed adjacent said connecting electrodes on opposite sides thereof, and wherein there are provided first and second conducting layers disposed on outer surfaces of said first and second insulating layers, respectively.

4. The document-reading camera tube apparatus as claimed in claim 1, wherein said connecting electrodes and said at least one conducting layer comprise copper foil in a thickness of 10 to 100 $\mu$m and wherein said insulating layers comprise flexible polyimide films having a thickness of 10 to 100 $\mu$m.

5. The document-reading camera tube apparatus as claimed in claim 1, wherein said at least one conducting layer is grounded.

* * * * *